(12) United States Patent
Premysler

(10) Patent No.: US 8,789,744 B2
(45) Date of Patent: Jul. 29, 2014

(54) REFLOW SOLDERABLE, SURFACE MOUNT OPTIC MOUNTING

(76) Inventor: Philip Premysler, Brooklyn, NY (US)

( * ) Notice: Subject to any disclaimer, the term of this patent is extended or adjusted under 35 U.S.C. 154(b) by 221 days.

(21) Appl. No.: 13/274,333

(22) Filed: Oct. 16, 2011

(65) Prior Publication Data

US 2012/0268957 A1 Oct. 25, 2012

Related U.S. Application Data

(60) Provisional application No. 61/394,499, filed on Oct. 19, 2010.

(51) Int. Cl.
*B23K 31/00* (2006.01)
*B23K 31/02* (2006.01)
*H01L 31/0256* (2006.01)
*H01L 21/00* (2006.01)
*H01L 21/02* (2006.01)

(52) U.S. Cl.
USPC ......... 228/122.1; 228/123.1; 257/79; 257/88; 438/23; 438/127; 438/905

(58) Field of Classification Search
USPC ............. 257/79, 88; 437/23, 127, 905; 228/122.1, 123.1; 438/23, 127, 905
See application file for complete search history.

(56) References Cited

U.S. PATENT DOCUMENTS

| | | | |
|---|---|---|---|
| 7,733,573 B2 | 6/2010 | Kim | |
| 8,226,276 B2 | 7/2012 | Pachler et al. | |
| 2010/0002450 A1* | 1/2010 | Pachler et al. | 362/311.02 |

* cited by examiner

*Primary Examiner* — Erin Saad

(57) ABSTRACT

Reflow solderable, surface mount LED optic mounting devices are provided. Embodiments that include turnings (e.g., made on a swiss turning machine) and stampings (e.g., made with a progressive die) are provided. The LED optic mounting devices are suitably positioned by the same pick-and-place machine that is used to mount LED on planar surface with circuitry and solder pads and are attached to the solder pads by soldering.

9 Claims, 5 Drawing Sheets

*Prior Art*

720

US 8,789,744 B2

REFLOW SOLDERABLE, SURFACE MOUNT OPTIC MOUNTING

CROSS REFERENCE TO RELATED APPLICATION

This application is based in part on provisional patent application 61/394,499 filed Oct. 19, 2010

FIELD OF THE INVENTION

The present invention relates generally to optoelectronics.

BACKGROUND

Light emitting diodes have become sufficiently luminous and efficacious in the past several years that they are now considered to be a viable light source for general illumination as well as various specialized illumination applications.

Power LEDs that are suitable for use in illumination applications generally produce a Lambertian-like distribution. (Departures from true Lambertian, can for example take the form a slightly contracted angular range, or somewhat higher intensity at high polar angles.) For many applications other types of light distributions are desired. Examples of other light distribution include, for example, a collimated beam, a beam with a 20° to 30° Full Width at Half Max (FWHM), or a 45° half-angle batwing distribution. In order to alter the light distribution from Lambertian a secondary lens can be used in conjunction with an LED. The lens is termed secondary to distinguish it from the lens that is part of a packaged LED and encapsulates the die of the LED. Examples of secondary lenses that can be used with LEDs to alter the distribution are taught in applicants co-pending, published World Patent Application PCT WO12010/027345.

LEDs and the associated secondary lenses are typically mounted on a printed circuit board (PCB). The LEDs are typically soldered. Soldering provides high quality electrical and thermal connection to the LED. Recently small outline surface mount LED packages that are soldered by the reflow soldering method have become popular. Secondary lenses are typically made of polycarbonate (PC) or polymethylmethacrylate (PMMA) which have a maximum service temperature not more than about 10° C. PC and PMMA are not meant to withstand the temperatures (e.g., 215 to 260 C.) used in reflow soldering. Because of this, the LEDs are first placed (e.g., using a pick-and-place machine) on a circuit board the solder is reflowed and after the LEDs are placed the lenses are attached. Because the LEDs are attached in one process on one apparatus and the lenses are attached in another process, the potential for misalignment of the lens and the LEDs arises. Alignment is important to avoid skewing the light beam emitted by the lens to one side. Aside from the issue misalignment the way in which lenses are attached according to the prior art has certain additional deficiencies.

One prior art way in which lenses for LEDs are mounted is described with reference to FIG. 1. Referring to FIG. 1, an LED 102 is shown mounted on a PCB 104. A lens holder 106 will be mounted on the PCB 104 with glue or an adhesive foam tape (not shown). A collimator type lens 108 will then be snap fit into the holder 106. While power LEDs used in illumination are meant to last tens of thousands of hours, it is unclear that glue or adhesive foam tape attached to the PCB 104 which may operate at temperatures approaching 100 C. would last tens of thousands of hours.

Another prior art way in which lenses for LEDs are mounted is described with reference to FIG. 2. Referring to FIG. 2, an LED 202 is shown mounted on a PCB 204. The PCB 204 has three thru-holes 206. A secondary lens 208 has three integrally molded standoffs 210. The standoffs 210 include end portions 212 which are inserted through the thru-holes 206 and then heat-staked in place. In heat-staking a heated probe is pressed against the end portions 212 and partly crushes them. The heat-staking makes a sort of nail-head shaped portion on the bottom side of the PCB 202. Aside from the complexity of the heat staking operation which is done manually one at a time with a soldering iron fitted with a special tip or one lens at time in a jig, there is also the cost of drilling the holes 206. Another problem with this is approach to attaching the lenses is that the nail head shaped portions formed by crushing the end portion 212 would prevent the PCB 202 from being placed flat on a heat sink (the nail head shaped portions would keep the PCB and heat sink apart.) This is disadvantageous because it is desirable to be simply mount the PCB against the base of a heat sink as a straight forward way to control the temperature of the LEDs.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Figure 1:
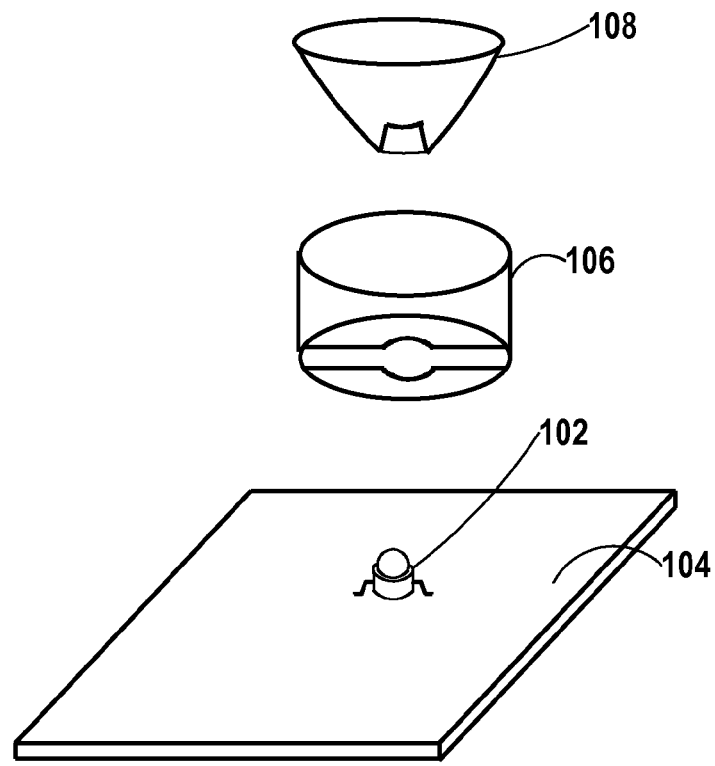
FIG. 1 illustrates a first prior art way of attaching secondary lenses for LEDs to a PCB.
Figure 2:
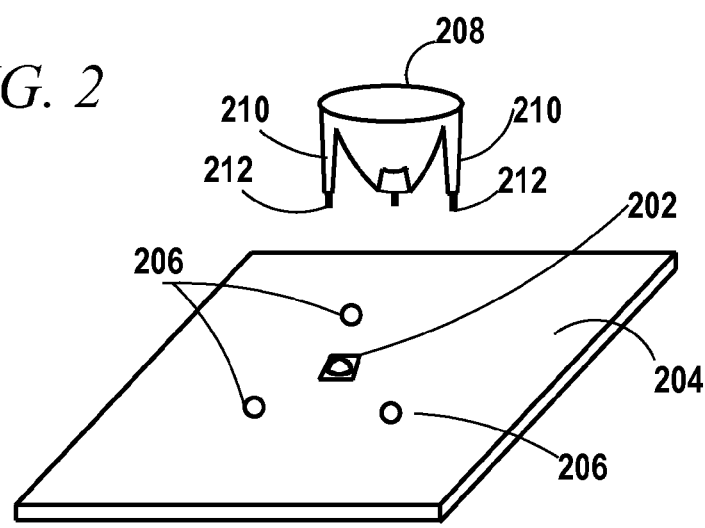
FIG. 2 illustrates a second prior art way of attaching secondary lenses for LEDs to a PCB.
Figure 3:
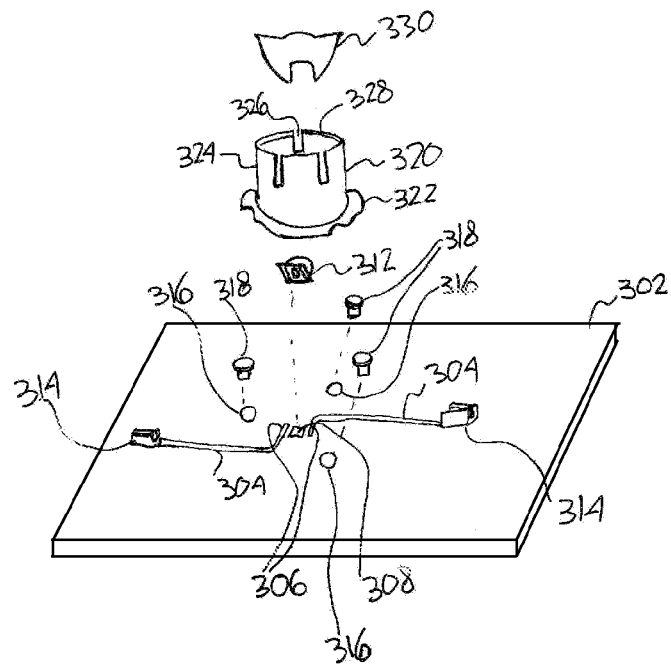
FIG. 3 illustrates a way of attaching secondary lenses for LEDs to a PCB according to a first embodiment of the invention.

FIG. 3 illustrates a way of attaching secondary lenses for LEDs to a PCB according to a first embodiment of the invention. Referring to FIG. 3 a PCB 302 is shown. The PCB 302 has a pair of LED power supply traces 304 that terminate in LED electrical connection solder pads 306. Between the electrical connection solder pads 306 is a thermal coupling solder pad 308. An LED 312 will be soldered to the electrical connection solder pads 306 and the thermal coupling solder pad 308. Reflow solderable single wire connectors 314 are soldered to pads (not visible) at the ends of the LED supply traces 304 that are remote from the LED electrical connection solder pads 306.

Three circular solder pads 316 are positioned around the electrical connection solder pads 306 and the thermal coupling solder pad 308. The circular solder pads 316 may for example be located 120 degrees apart on a virtual circle that is centered on the position of a die of the LED 312, when the LED 312 is mounted. Three mounting bosses 318 are provided. The mounting bosses 318 will be located on the circular solder pads 316 and will be reflow soldered thereto.

Figure 4:
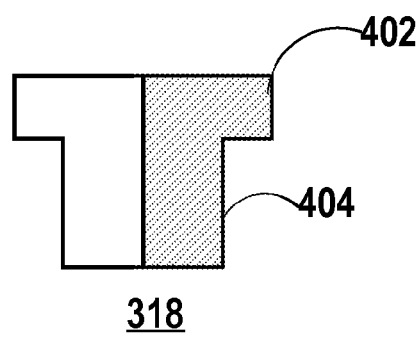
FIG. 4 shows a partial-section elevation view of a reflow-solderable, surface-mount LED lens holder mounting boss that is used in the embodiment shown in FIG. 3.

FIG. 4 shows a partial-section elevation view of one of reflow-solderable, surface-mount LED lens holder mounting bosses 318 that is used in the embodiment shown in FIG. 3. In the embodiment shown in FIG. 4 the mounting boss 318 is a turned part that is suitably made on an automatic Swiss turning machine. A turned part is generally rotationally symmetric. The mounting boss 318 comprises a larger diameter top portion 402 and a smaller diameter bottom portion 404. Although not shown, alternatively a hole (e.g., a blind hole) can be drilled axially through the center of the mounting boss 318. The hole may be drilled from the top (large diameter) end. The LED 312 and the mounting bosses 318 can be placed on the PCB 302 by the same pick-and-place machine, and soldered in the same solder reflow process. Therefore registration (alignment between the LED and the mounting bosses 318 can be achieved.

A lens holder 320 mechanically connects to the mounting bosses 318. The lens holder includes flange 322 which locates against the PCB 302 and a cylindrical portion 324 which extends away from the flange 322 and away from the PCB 302. Three slots 326 extend downward from a top end (remote from flange 322) of cylindrical portion 324. The slots 326 provide flexibility. The top end of the cylindrical portion 324 also includes an inwardly extending lip 328. The lip 328 grips a TIR type LED lens 330 which is placed in the lens holder 320. With the mounting bosses 318 and the LED 312 are soldered to the PCB 302 after being located in a common process/apparatus, and the lens holder 320 fixed by the mounting bosses 318 and the lens 330 fixed by the lens holder 320, alignment between the lens 330 and the LED 312 is achieved.

Figure 5:
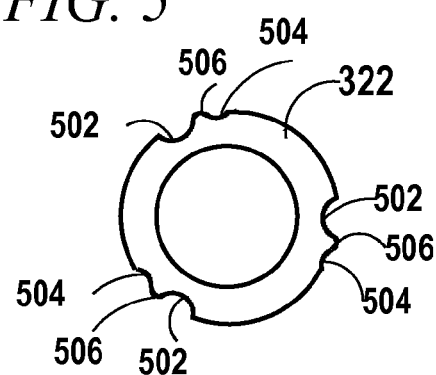
FIG. 5 is a plan view of a first twist lock lens holder that used in the embodiment illustrated in FIG. 3 and FIG. 4.

FIG. 5 is a plan view of a first twist lock lens holder 320 that is used in the embodiment illustrated in FIG. 3 and FIG. 4. The shape of the flange 322 is shown prominently. The flange 322 has three deep radially inwardly extending edge portions 502 that are spaced around the flange 322. 120 degrees apart. Adjacent to portions 502 are three shallow radially inwardly extending edge portions 504. Three small rounded peaks 506 are formed at the junction of the shallow portions 504 and the deep portions 502. The deep portions 502 are deep enough to clear the larger diameter top portions 402 of the mounting bosses 318. After the lens holder 320 is place between the mounting bosses 318 it is rotated so the small rounded peaks 506 snap past the smaller diameter bottom portions 404 of the mounting bosses which then seat in the shallow portions 504. Then the lens 330 can be snapped into the holder 320.

Figure 6:
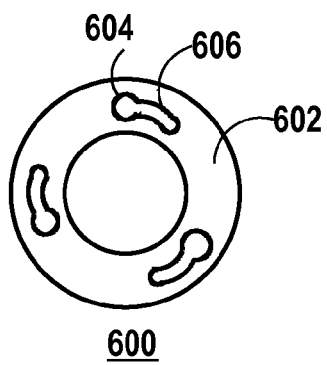
FIG. 6 is a plan view of an alternative twist lock lens holder that is used in the embodiment illustrated in FIG. 3 and FIG. 4.

FIG. 6 is a plan view of an alternative twist lock lens holder 600 that is used in the embodiment illustrated in FIG. 3 and FIG. 4. The lens holder 600 has a flange 602 of a different design. The flange 602 includes three holes 604 that are large enough to pass the large diameter top portions 402 of the mounting bosses 318. The three holes are connected to three arcuate slots 606. In use the holder 600 is placed over the mounting bosses 318 and then twisted so that the smaller diameter bottom portions 404 of the mounting bosses locate in the arcuate slots 604.

Figure 7:
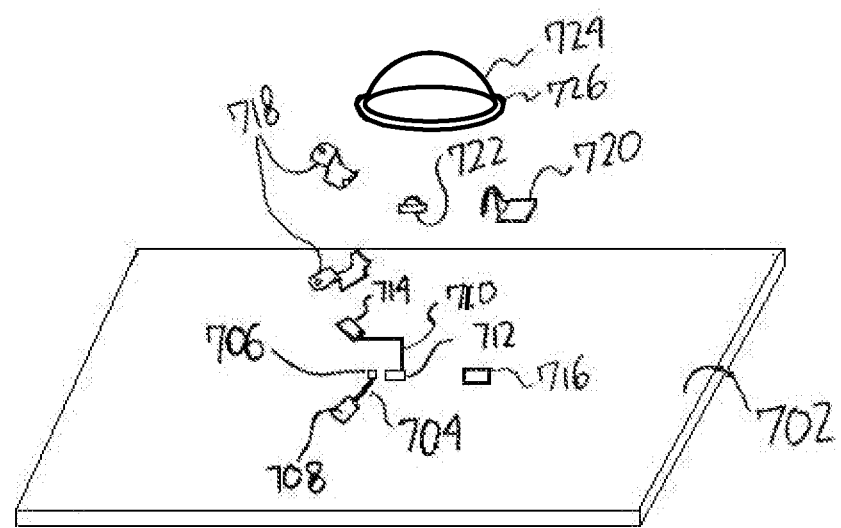
FIG. 7 illustrates a way of attaching secondary lenses for LEDs to a PCB according to a second embodiment of the invention.

FIG. 7 illustrates a way of attaching secondary lenses for LEDs to a PCB according to a second embodiment of the invention. Referring to FIG. 7 a PCB 702 is shown. The PCB 702 includes a first trace 704 terminated at one end by a first LED connection solder pad 706 and at a second end by a second solder pad 708. The PCB 702 further includes a second trace 710 terminated at one end by a second LED connection solder pad 712 and at a second end by a fourth solder pad 714. A fifth solder pad 716 is also located on the PCB 702. The second solder pad 708, the fourth solder pad 714 and the fifth solder pad 716 are located 120 degrees apart on a circle centered at an LED position (coincident with the LED connection solder pads 706, 712).

Two rigid, reflow solderable, surface mount LED mounting bosses 718 locate on the second solder pad 708 and the fourth solder pad 714. A resilient armed, reflow solderable, surface mount LED mounting boss 720 locates on the fifth solder pad 716. An LED 722 locates on LED connection solder pads 706, 712, and a LED secondary lens 724 is held on the PCB by the LED mounting bosses 718, 720.

Figure 8:
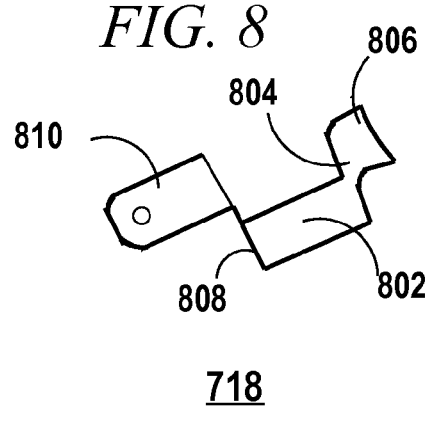
FIG. 8 shows a rigid, stamped, reflow-solderable, surface-mount LED lens mounting boss that is used in the embodiment shown in FIG. 7.

FIG. 8 shows one of the rigid, stamped, reflow-solderable, surface-mount LED lens mounting bosses 718 that is used in the embodiment shown in FIG. 7. The mounting boss 718 is suitably made by stamping, e.g., in a progressive die. The boss 718 includes a lower horizontal portion 802 that will be soldered to one of the solder pads 708, 714. The lower horizontal portion 802 is connected at a first end to a first vertically extending portion 804 which leads to a lens engaging portion 806. The lens engaging portion 806 has an arcuate edge that may have a radius equal to a radius of a portion of a lens to be engaged. A second end of the lower horizontal portion is connected to a second vertically extending portion 808 which leads to male tab connector portion 810. A female connector (not shown) that terminates a wire can connect to the tab connector portion. Thus the mounting boss 718 can serve the dual purpose of holding the lens 724 in place and providing electrical connection to the LED 722.

Figure 9:
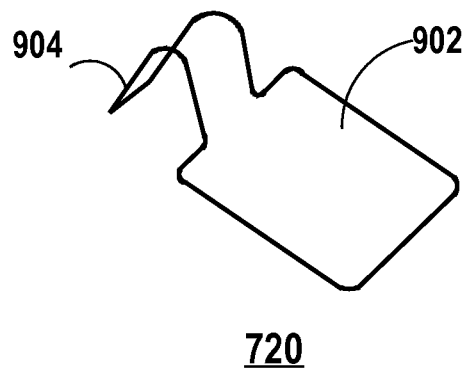
FIG. 9 shows a resilient armed, stamped, reflow-solderable, surface mount LED lens mounting boss that is used in the embodiment show in FIG. 7.

FIG. 9 shows the resilient armed, stamped, reflow-solderable, surface mount LED lens mounting boss 720 that is used in the embodiment show in FIG. 7. The mounting boss 720 includes a lower horizontal portion 902 that is soldered to the fifth solder pad 716. A bent resilient arm 904 first extends up from the lower horizontal portion 904 and then bends back downward. The lens 724 includes a peripheral flange 726. To place the lens 724, it is tilted to place flange 726 under the lens engaging portions 706 of the rigid mounting bosses 718 then a part of the flange 726 located at the resilient arm 904 is pressed down so that the end of the resilient arm 904 snaps over the flange 726. It may be necessary to simultaneously apply a slight lifting and or outward radial force on the resilient arm to get it to position over the flange 726.

Figure 10:
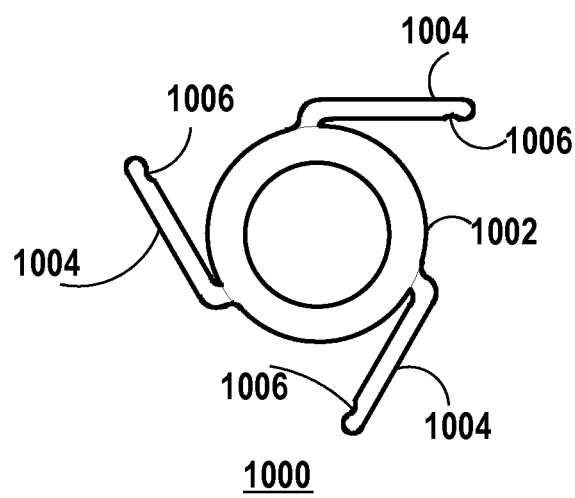
FIGS. 10-11 show a integral resilient armed, stamped reflow-solderable surface mount LED lens mounting for a TIR type LED lens.
Figure 11:
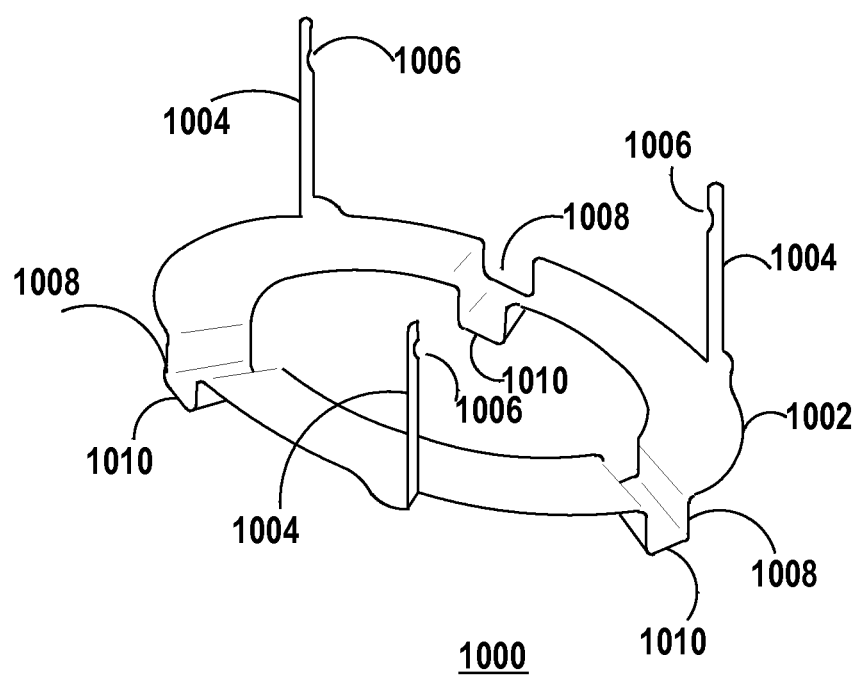

FIGS. 10-11 show a integral resilient armed, stamped reflow-solderable surface mount LED lens mounting 1000 for a TIR type LED lens, such as 330 shown in FIG. 3. If the mounting 1000 is used it is unnecessary to use a separate holder such as 320 used in the embodiment shown in FIG. 3. The mounting 1000 is a stamping made from sheet metal. FIG. 10 shows the layout of the mounting prior to bending operations used to shape the mounting 1000. The mounting 1000 includes a ring 1002 from which 3 prongs 1004 extend axially upward. The prongs 1004 include inward facing concavity features 1006 that are adapted to engage a flange of a TIR type lens. The annular ring 1002 include 3 U-shaped drooped portions 1008 each of which includes a base 1010 which is adapted to seat on solder pads of a circuit board and be soldered thereto. Thus most of the ring 1002 will be supported above the circuit board. The stamped parts 718, 720, 1000 are preferably made from sheet metal less than 1 mm thick and more preferably less than 0.5 mm thick.

Figure 12:
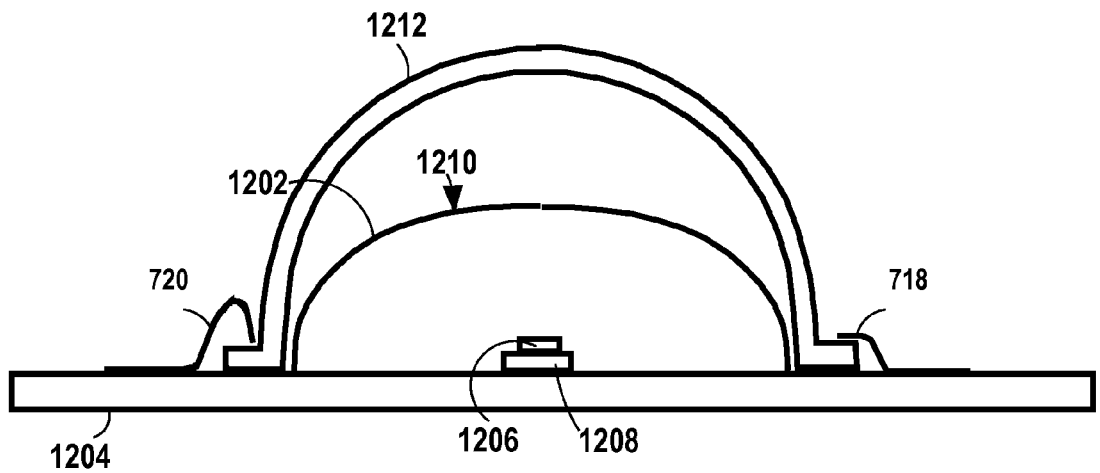
FIG. 12 shows a remote phosphor dome mounted using surface mount reflow solderable optics mounting devices according to an embodiment of the invention.

FIG. 12 shows a remote phosphor dome mounted using surface mount reflow solderable optics mounting devices. As shown in FIG. 12 a primary type lens 1202 encapsulates an LED 1206 mounted on a submount 1208 which is mounted on a Metal Core Printed Circuit Board (MCPCB) 1204. The primary lens 1202 includes only a single outer surface 1210 at which light is refracted in order to redistribute the light. A remote luminescent material (e.g., phosphor) dome 1212 is positioned over the lens 1202. The dome 1212 is held in position by one or more (one shown) of the rigid mounting bosses 718 and one or more (one shown) of the resilient arm mounting bosses 720. The remote luminescent material dome 1212 and lens 1210 combination is taught in co-pending provisional patent application No. 61/538,907 entitled "Led Remote Photoluminescent Material Package" filed by the instant inventor on Sep. 25, 2011. Alternatively in lieu of remote luminescent material domes 1212 light diffusing domes can be mounted using the surface mount reflow solderable mounting devices taught herein.

Figure 13:
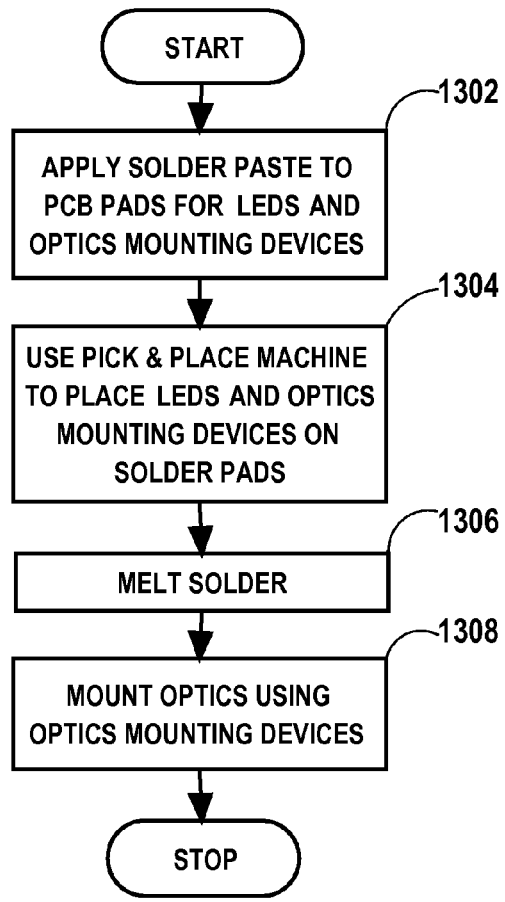
FIG. 13 is a flowchart of a method of mounting LEDs and associated optics on a PCB according to an embodiment of the invention.

FIG. 13 is a flowchart of a method of mounting LEDs and associated optics on a PCB according to an embodiment of the invention. In block 1302 solder paste is applied to solder pads of a PCB that will be used to mount LEDs and LED optics mounting devices (e.g., 318, 718, 720, 1000). In block 1304 a pick-and-place machine is used to mount the LEDS and the optic mounting devices on the solder pads. In block 1306 the solder is melted (e.g., in a solder reflow oven) and then allowed to cool and in block 1308 LED optics are mounted using the LED optics mounting devices that were attached in blocks 1302, 1304 and 1306.

Although as shown above the LEDs and surface mount, reflow-solderable LED lens mounting devices and LEDs are mounted on a PCB, alternatively in lieu of a PCB another object that has circuitry traces and solder pads formed on a surface can be used. For example the surface of a heat sink may be used.

As used herein the term optics includes lenses, diffusers and remote phosphor domes which are fitted over LEDs in order to change the spectrum of light emitted by LEDs.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

I claim:

1. A method of making an assembly, the method comprising:
    applying solder paste to at least a first solder pad and a second solder pad;
    using a pick-and-place machine to place an LED on said first solder pad;
    using said pick-and-place machine to place a first surface mount LED optic mounting device on said second solder pad;
    melting said solder and allowing said solder to cool, wherein said LED becomes soldered to said first solder pad and said first surface mount LED optic mounting device becomes soldered to said second solder pad; and
    after melting said solder and allowing said solder to cool, coupling an optic to said first surface mount LED optic mounting device.

2. The method according to claim 1 wherein using said pick-and-place machine to place said first surface mount LED optic mounting device on said second solder pad comprises:
    using said pick-and-place machine to place a surface mount mounting boss on said second solder pad.

3. The method according to claim 2 wherein coupling said first optic to said first surface mount, LED optic mounting device comprises:
    engaging an optic holder with said surface mount mounting boss; and
    engaging an LED optic with said optic holder.

4. The method according to claim 2 wherein coupling said optic to said first surface mount, LED optic surface mount mounting device comprises:
    engaging an LED optic with said surface mount mounting boss.

5. The method according to claim 1 further comprising:
    applying solder paste to a third solder pad;
    using said pick-and-place machine to place a second surface mount LED optic mounting device on said third solder pad;
    wherein said second surface mount LED optic mounting device becomes soldered to said third solder pad when said solder is melted and allowed to cool; and
    after melting said solder and allowing said solder to cool, coupling said optic to said second surface mount LED optic mounting device.

6. The method according to claim 1 wherein coupling said optic comprise coupling an optic selected from a group consisting of a lens, a remote photoluminescent component, and a diffusing component.

7. The method according to claim 1 further comprising:
    establishing an electrical coupling to said LED through said first surface mount LED optic mounting device.

8. The method according to claim 1 further comprising:
    making the first surface mount LED optic mounting device by stamping.

9. The method according to claim 1 further comprising:
    making the first surface mount LED optic mounting device by turning.

* * * * *